United States Patent
Rizzolo et al.

(10) Patent No.: US 10,714,681 B2
(45) Date of Patent: Jul. 14, 2020

(54) EMBEDDED MAGNETIC TUNNEL JUNCTION PILLAR HAVING REDUCED HEIGHT AND UNIFORM CONTACT AREA

(71) Applicant: International Business Machines Corporation, Armonk, NY (US)

(72) Inventors: Michael Rizzolo, Delmar, NY (US); Theodorus E. Standaert, Clifton Park, NY (US); Cornelius Brown Peethala, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/165,352

(22) Filed: Oct. 19, 2018

(65) Prior Publication Data
US 2020/0127194 A1  Apr. 23, 2020

(51) Int. Cl.
*H01L 43/12* (2006.01)
*H01L 43/02* (2006.01)

(52) U.S. Cl.
CPC .............. *H01L 43/12* (2013.01); *H01L 43/02* (2013.01)

(58) Field of Classification Search
None
See application file for complete search history.

(56) References Cited

U.S. PATENT DOCUMENTS

| | | | |
|---|---|---|---|
| 7,993,535 B2 | 8/2011 | Jiang et al. | |
| 8,772,888 B2 | 7/2014 | Jung et al. | |
| 9,276,195 B2 | 3/2016 | Kanaya et al. | |
| 9,406,876 B2 | 8/2016 | Pinarbasi | |
| 9,685,406 B1 | 6/2017 | Briggs et al. | |
| 9,698,342 B2 | 7/2017 | Ito | |
| 9,741,415 B2 | 8/2017 | Han | |
| 9,887,350 B2 | 2/2018 | Shen et al. | |
| 2005/0254180 A1* | 11/2005 | Kanakasabapathy | H01L 43/12 360/324.2 |
| 2009/0209050 A1 | 8/2009 | Wang et al. | |
| 2010/0065935 A1* | 3/2010 | Horng | B82Y 25/00 257/421 |
| 2011/0198314 A1* | 8/2011 | Wang | B82Y 25/00 216/22 |
| 2013/0119494 A1 | 5/2013 | Li et al. | |

(Continued)

OTHER PUBLICATIONS

Assefa et al., "Fabrication and characterization of MgO-based magnetic tunnel junctions for spin momentum transfer switching," Journal of Applied Physics 102.6, 2007, 063901, 5 pages.

(Continued)

*Primary Examiner* — Sitaramarao S Yechuri
(74) *Attorney, Agent, or Firm* — Cantor Colburn LLP; Vasken Alexanian

(57) ABSTRACT

Embodiments of the invention are directed to a method of forming a memory element pillar. The method includes forming memory element stack layers, forming a conductive cap layer over the memory element stack layers, forming a conductive seal layer over the cap layer, and forming a conductive etch stop layer over the conductive seal layer, wherein the conductive etch stop layer comprises a substantially planar surface. A hardmask is formed over the substantially planar surface of the conductive etch stop layer, wherein the hardmask defines dimensions of the memory element pillar.

20 Claims, 13 Drawing Sheets

(56) References Cited

U.S. PATENT DOCUMENTS

| | | | | |
|---|---|---|---|---|
| 2014/0175581 A1* | 6/2014 | Guo | ...................... | H01L 27/224 |
| | | | | 257/421 |
| 2014/0241047 A1* | 8/2014 | Guo | ........................ | H01L 43/12 |
| | | | | 365/158 |
| 2015/0280113 A1* | 10/2015 | Tan | ........................ | H01L 43/12 |
| | | | | 438/3 |
| 2016/0351798 A1* | 12/2016 | Shen | ........................ | H01L 43/12 |
| 2017/0033283 A1 | 2/2017 | Pinarbasi et al. | | |
| 2018/0019387 A1* | 1/2018 | Tan | ........................ | H01L 41/47 |
| 2018/0040668 A1 | 2/2018 | Park et al. | | |
| 2018/0076263 A1* | 3/2018 | Sugiura | ................. | H01L 27/228 |
| 2018/0351080 A1* | 12/2018 | Bak | ........................ | H01L 43/02 |
| 2019/0103414 A1* | 4/2019 | Ramkumar | ......... | H01L 29/4234 |

OTHER PUBLICATIONS

Teixeira et al., "Ion irradiation-induced easy-cone anisotropy in double-MgO free layers for perpendicular magnetic tunnel junctions," Applied Physics Letters 112.20, 2018, 202403, 6 pages.

\* cited by examiner

EMBEDDED MAGNETIC TUNNEL JUNCTION PILLAR HAVING REDUCED HEIGHT AND UNIFORM CONTACT AREA

BACKGROUND

The present invention relates in general to fabrication methodologies and resulting structures for semiconductor devices. More specifically, the present invention is related to fabrication methodologies and resulting structures for embedding magnetic tunnel junction (MTJ) pillars into back-end-of-line interconnects, wherein the embedded MTJ pillar has reduced height and uniform contact area.

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts and other structures that couple to active regions (e.g., gate/source/drain) of the FEOL device elements. Layers of interconnections are formed above these logical and functional layers during the BEOL stage to complete the IC.

Memory structures such as MTJ stacks can be embedded in BEOL interconnect structures. The MTJ stack can be part of an MTJ pillar that includes the MTJ stack, a cap formed on the MTJ stack, and a conductive hardmask formed over the cap. The MTJ pillar can be electrically accessed through a top contact coupled to the conductive hardmask, and a bottom contact coupled to the bottom of the MJT stack.

SUMMARY

Embodiments of the invention are directed to a method of forming a memory element pillar. The method includes forming memory element stack layers, forming a conductive cap layer over the memory element stack layers, forming a conductive seal layer over the cap layer, and forming a conductive etch stop layer over the conductive seal layer, wherein the conductive etch stop layer comprises a substantially planar surface. A hardmask is formed over the substantially planar surface of the conductive etch stop layer, wherein the hardmask defines dimensions of the memory element pillar.

Embodiments of the invention are directed to a method of forming a memory element pillar. The method includes forming memory element stack layers, forming a conductive cap layer over the memory element stack layers, and forming a conductive seal layer over the cap layer, wherein the conductive seal layer comprises a substantially planar surface. A sacrificial layer is formed over the conductive seal layer. A hardmask is formed over the sacrificial, wherein the hardmask defines dimensions of the memory element pillar.

Embodiments of the invention are directed to an embedded memory element pillar structure that includes a semiconductor wafer having a dielectric region. A memory element pillar is embedded in the dielectric region. The memory element pillar includes a memory element stack, a conductive cap over the memory element stack, a conductive seal layer over the cap layer, and a conductive etch stop layer over the conductive seal layer. The conductive etch stop layer includes a substantially planar surface. A top contact is communicatively coupled to the substantially planar surface of the conductive etch stop layer.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 4-9 depict various structures after fabrication operations for forming the planar MTJ pillar shown in FIG. 2 embedded in BEOL regions of a semiconductor wafer, in which:

FIG. 4 depicts a cross-sectional view of a semiconductor wafer after fabrication operations according to embodiments of the invention;

FIG. 5 depicts a cross-sectional view of a semiconductor wafer after fabrication operations according to embodiments of the invention;

FIG. 6 depicts a cross-sectional view of a semiconductor wafer after fabrication operations according to embodiments of the invention;

FIG. 7 depicts a cross-sectional view of a semiconductor wafer after fabrication operations according to embodiments of the invention;

FIG. 8 depicts a cross-sectional view of a semiconductor wafer after fabrication operations according to embodiments of the invention; and FIG. 9 depicts a cross-sectional view of a semiconductor wafer after fabrication operations according to embodiments of the invention; and FIGS. 10-14 depict various structures after fabrication operations for forming the planar and recessed MTJ pillar shown in FIG. 3 embedded in BEOL regions of a semiconductor wafer, in which:

FIG. 10 depicts a cross-sectional view of a semiconductor wafer after fabrication operations according to embodiments of the invention;

FIG. 11 depicts a cross-sectional view of a semiconductor wafer after fabrication operations according to embodiments of the invention;

FIG. 12 depicts a cross-sectional view of a semiconductor wafer after fabrication operations according to embodiments of the invention;

FIG. 13 depicts a cross-sectional view of a semiconductor wafer after fabrication operations according to embodiments of the invention; and FIG. 14 depicts a cross-sectional view of a semiconductor wafer after fabrication operations according to embodiments of the invention.

DETAILED DESCRIPTION

Figure 1:
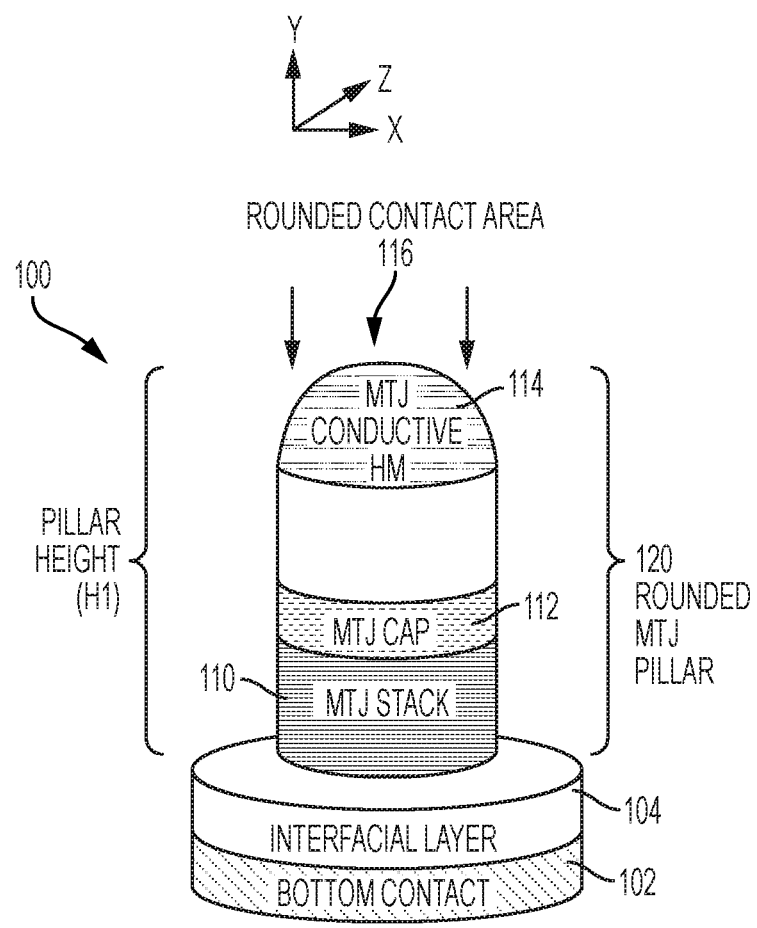
FIG. 1 depicts a prior art rounded MTJ pillar.

It is understood in advance that, although this description includes a detailed description of the formation and resulting structures for a specific type of embedded MTJ pillar, implementation of the teachings recited herein are not limited to the particular type of embedded memory element or IC architecture described herein. Rather embodiments of the present invention are capable of being implemented in conjunction with any other type of memory element or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, with the growth of digital data applications, there is a need for increasingly fast and scalable memory technologies for data storage and data-driven computation. Electronic memory can be classified as volatile or non-volatile. Volatile memory retains its stored data only when power is supplied to the memory, but non-volatile memory retains its stored data without constant power. Volatile random access memory (RAM) provides fast read/write speeds and easy re-write capability. However, when system power is switched off, any information not copied from volatile RAM to a hard drive is lost. Although non-volatile memory does not require constant power to retain its stored data, it in general has lower read/write speeds and a relatively limited lifetime in comparison to volatile memory.

Magnetoresistive random access memory (MRAM) is a non-volatile memory that combines a magnetic device with standard silicon-based microelectronics to achieve the combined attributes of non-volatility, high-speed read/write operations, high read/write endurance and data retention. The term "magnetoresistance" describes the effect whereby a change to certain magnetic states of the MTJ storage element (or "bit") results in a change to the MTJ resistance, hence the name "Magnetoresistive" RAM. A basic MTJ stack includes a free layer and a fixed/reference layer, each of which includes a magnetic material layer. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction.

An MTJ stack stores information by switching the magnetization state of the free layer. When the free layer's magnetization direction is parallel to the reference layer's magnetization direction, the MTJ is in a low resistance state. Conversely, when the free layer's magnetization direction is anti-parallel to the reference layer's magnetization direction, the MTJ is in a high resistance state. The difference in resistance of the MTJ can be used to indicate a logical "1" or "0," thereby storing a bit of information. The tunneling magnetoresistance (TMR or MR) of an MTJ determines the difference in resistance between the high and low resistance states. A relatively high difference between the high and low resistance states facilitates read operations in the MRAM.

As previously described herein, MTJ stacks can be embedded in BEOL interconnect structures. The MTJ stack can be part of an MTJ pillar, a known example of which is depicted in FIG. 1. In FIG. 1, an MTJ structure 100 includes a bottom contact 102, an interfacial layer 104, and a rounded MTJ pillar 120, configured and arranged as shown. The rounded MTJ pillar 120 includes an MTJ stack 110, a cap 112 formed on the MTJ stack 110, and a conductive hardmask 114 formed over the cap 112. As a result of standard fabrication processes, the conductive hardmask 114 has a rounded contact area 116. The MTJ pillar 120 can be electrically accessed through a top contact (not shown) communicatively coupled to the conductive hardmask 114 at the rounded contact area 116. The MTJ pillar 120 is also electrically accessed through the bottom contact 102, which is communicatively coupled through the interfacial layer 104 to a bottom surface of the MJT stack 110.

One challenge when integrating an MTJ pillar 120 into the BEOL wiring layers of silicon logic and memory chips is that known fabrication operations for forming the conductive HM 114 results variations in the rounded contact area 116, which causes unwanted device performance variations. Another challenge of integrating the MTJ pillar 120 into BEOL wiring layers is that the ability to scale adjacent metallization layers to be closer together is limited by the height (H1) of the rounded MTJ pillar 120, and particularly, the height of the MTJ conductive hardmask 114.

Turning now to an overview of aspects of the present invention, embodiments of the invention address the shortcomings of the prior art by providing fabrication methodologies and resulting structures for embedding MTJ pillars into back-end-of-line interconnects, wherein the embedded MTJ pillar has reduced height and uniform contact area. In embodiments of the invention, the MTJ conductive hardmask 114 and rounded contact area 116 used in the prior art is replaced by a multi-layer hardmask having a conductive seal region and a conductive etch stop region having a substantially planar contact area. The height dimension of the planar MTJ pillar formed by the multi-layer hardmask and an MTJ stack is less than the height H1 of the rounded MTJ pillar 120 formed using known fabrication operations. In some embodiments of the invention, the MTJ conductive hardmask 114 and rounded contact area 116 used in the prior art is replaced by a hardmask formed from a conductive seal region having a substantially planar and recessed contact area. The height dimension of the planar & recessed MTJ pillar formed by the planar/recessed conductive seal hardmask and an MTJ stack is less than the height H1 of the rounded MTJ pillar 120 formed using known fabrication operations.

Figure 2:
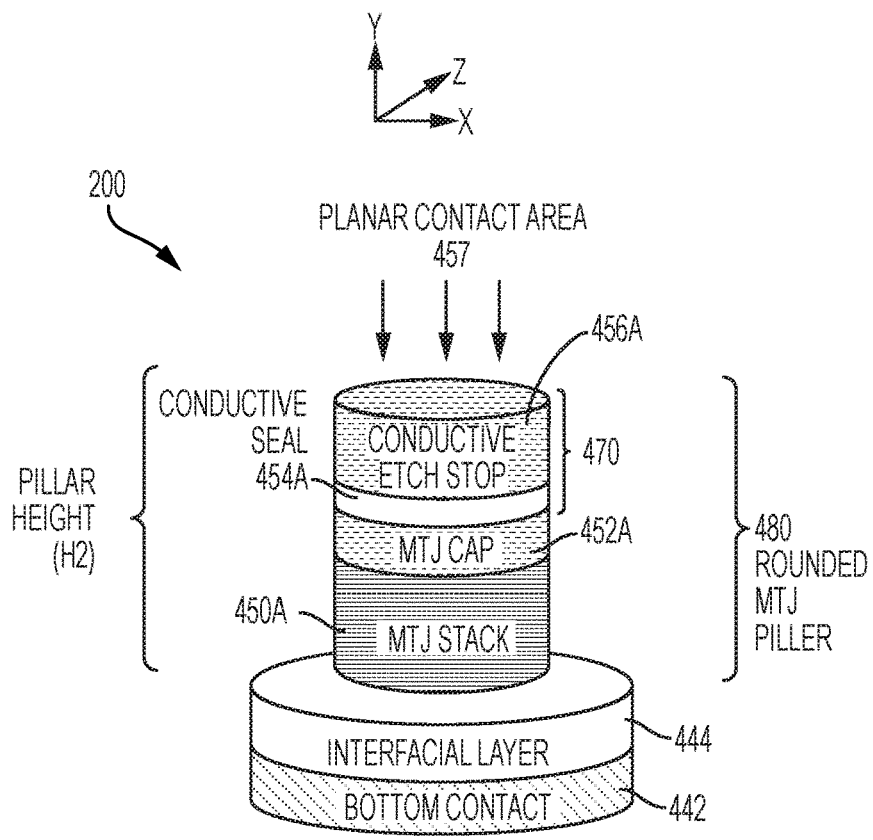
FIG. 2 depicts a planar MTJ pillar according to embodiments of the invention.

Turning now to a more detailed description of example embodiments of the invention, FIG. 2 depicts an MTJ structure 200 in accordance with aspects of the invention. The MTJ structure 200 includes a bottom contact 442, an interfacial layer 444, and a planar MTJ pillar 480, configured and arranged as shown. The planar MTJ pillar 480 includes an MTJ stack 450A, a cap 452A formed on the MTJ stack 450A, and a multi-layer hardmask 470 formed over the cap 452A. The multi-layer hardmask 470 includes a conductive seal region 454A and a conductive etch stop region 456A having a substantially planar contact area 457. The height dimension (H2) of the planar MTJ pillar 480 formed by the multi-layer hardmask 470 and the MTJ stack 450A is less than the height H1 of the rounded MTJ pillar 120 (shown in FIG. 1) formed using known fabrication operations.

Figure 4:
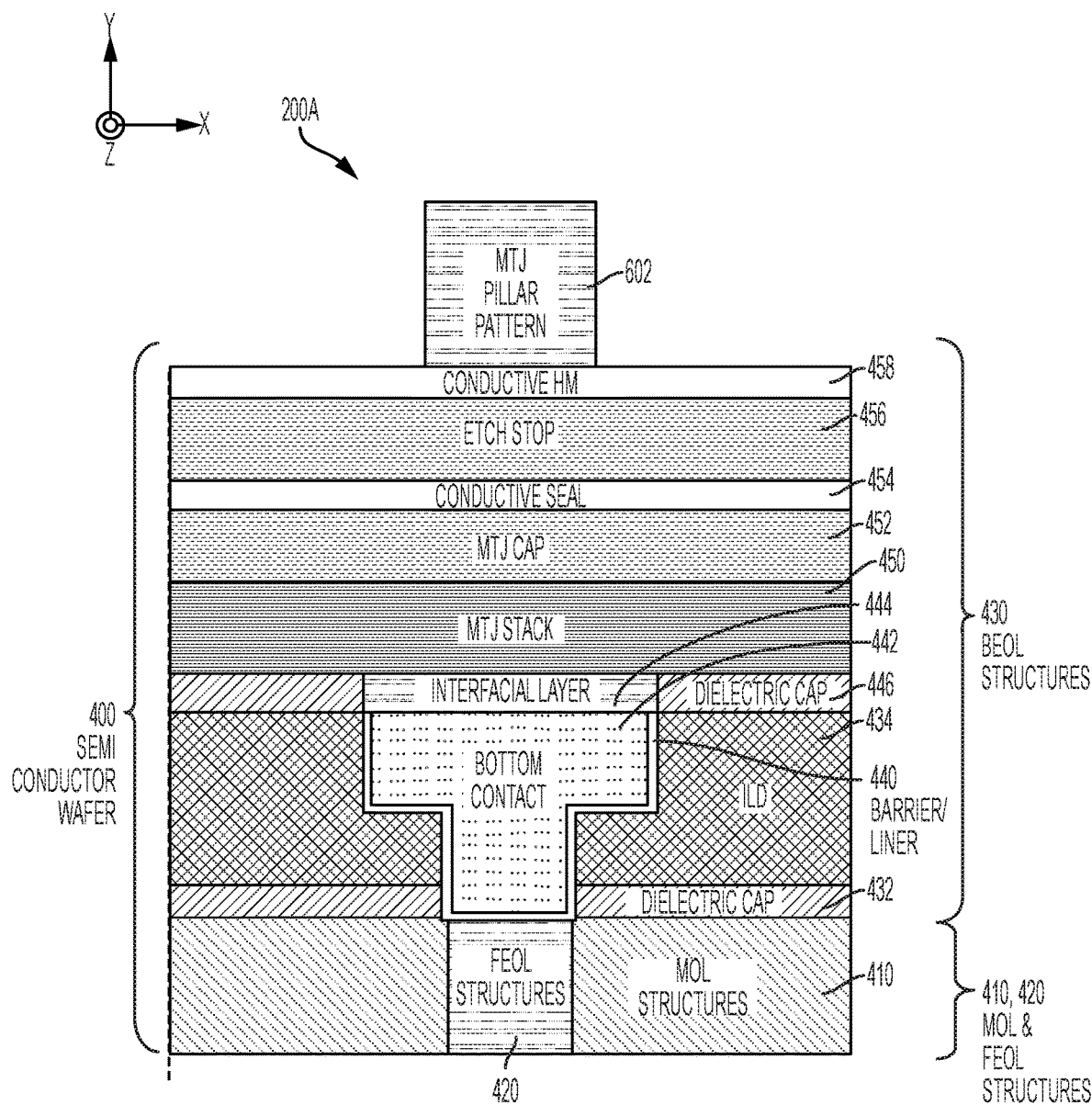

As a result of fabrication processes in accordance with embodiments of the invention, the conductive etch stop region 456A has a substantially planar contact area 457. Fabrication operations for forming the MTJ structure 200 embedded into BEOL interconnects of a semiconductor wafer 400 in accordance with aspects of the invention are depicted in FIGS. 4-9. The portion of the semiconductor wafer 400 that will form the MTJ structure 200 is identified generally in FIGS. 4-9 by reference number 200A. FIG. 4 depicts a semiconductor wafer 400 after an initial set of fabrication operations in accordance with aspects of the invention. A variety of well-known fabrication operations are suitable for forming the semiconductor wafer 400 to the fabrication stage shown in FIG. 4. Accordingly, in the interest of brevity, such well-known fabrication operations are either omitted or described and illustrated at a high level. At the fabrication stage shown in FIG. 4, suitable fabrication operations have been used to form the FEOL structures 420 and the MOL structures 410. Formed on top of the FEOL and MOL structures 420, 410 are a dielectric cap 432, an interlayer dielectric (ILD) region 434, a dielectric cap 446, a barrier/liner 440, a bottom contact 442, and an interfacial layer 444, configured and arranged as shown. The bottom contact 442 can be formed by depositing the dielectric cap 432, the ILD 434, and the dielectric cap 446 then forming a trench through the dielectric cap 446, the ILD 434, and the dielectric cap 432. The barrier/liner 440 is deposited in the trench, the bottom contact 442 is filled in over the barrier/liner 440, and the interfacial layer 444 is formed over the top surface of the bottom contact. Above the dielectric cap 446 and the interfacial dielectric layer 444, various layers have been deposited, including MTJ stack layers 450, MTJ cap layer 452, a conductive seal layer 454, and etch stop layer 456, a conductive hardmask layer 458. A pattern 602 is formed over the conductive hardmask layer 458 to define the x-z plane dimensions of the planar MJT pillar 480 (shown in FIG. 2) that will be formed from the conductive hardmask layer 458, the etch stop layer 456, the conductive seal layer 454, and the MTJ stack layers 450.

Figure 5:
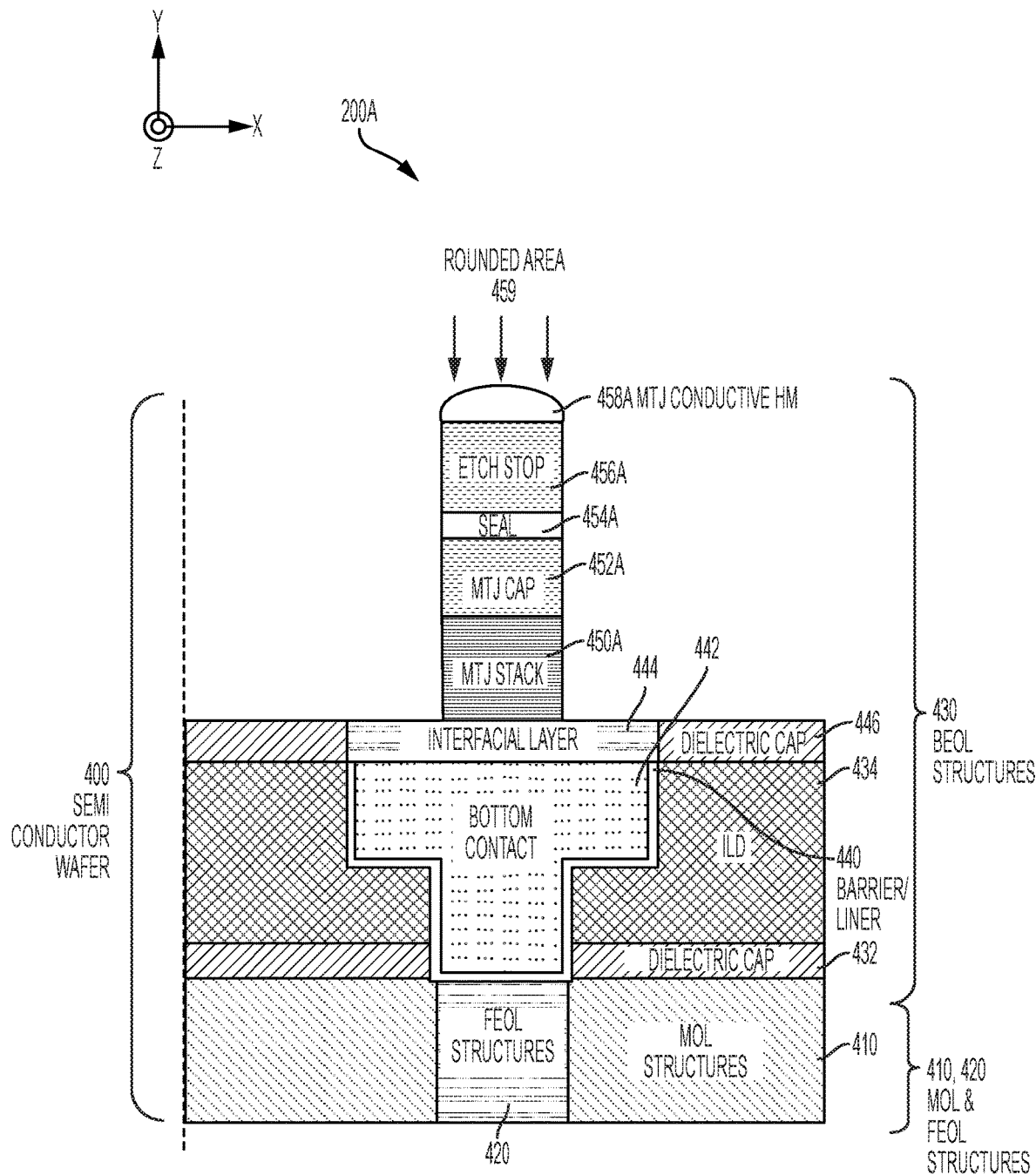

In FIG. 5, the pattern 602 (shown in FIG. 4) has been transferred to the conductive hardmask layer 458 (shown in FIG. 4) through etching to form a conductive hardmask 458A. Similar to the pattern 602, the conductive hardmask 458A also defines the x-z plane dimensions of the planar MJT pillar 480 (shown in FIG. 2). The x-z plane dimensions of the conductive hardmask 458A have been transferred through etching (e.g., an ion beam etch (IBE) or a reactive ion etch (RIE)) into the etch stop layer 456, the conductive seal layer 454, the MTJ cap layer 452, and the MTJ stack layer 450 (all shown in FIG. 4) to form the etch stop region 456A, the conductive seal region 454A, the MTJ cap 452A, and the MTJ stack 450A. The conductive seal region 454A is configured and arranged to protect the MTJ cap 452A. As shown in FIG. 5, a natural result of this etch process is that the etch used to form the etch stop region 456A, the conductive seal region 454A, the MTJ cap 452A, and the MTJ stack 450A will also round the exposed top surface 459 of the conductive hardmask 458A in a non-uniform manner.

Figure 6:
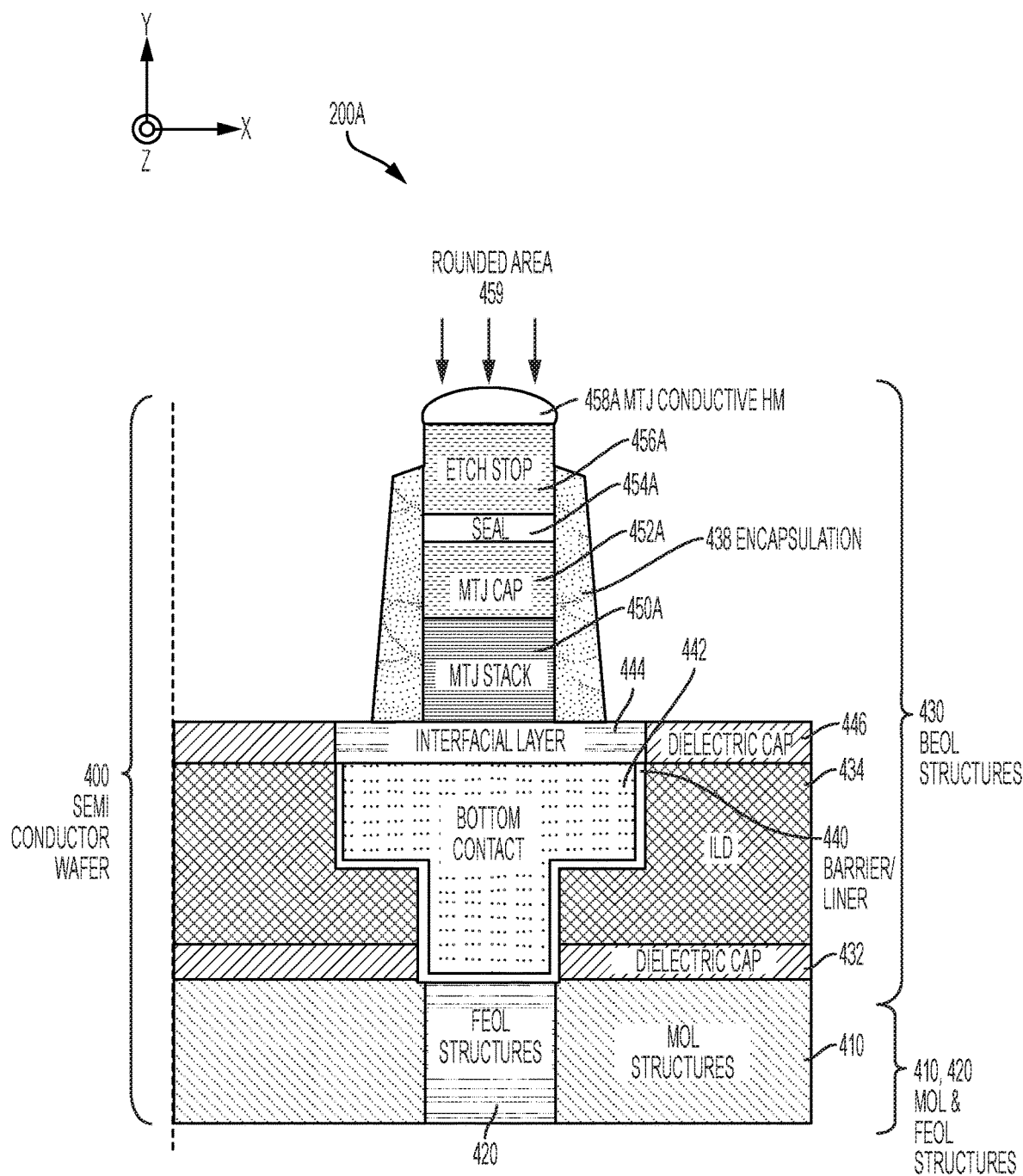

In FIG. 6, known semiconductor fabrication operations have been used to form an encapsulation layer (or spacers) 438 around the MTJ stack 450A, the MTJ cap 452A, the conductive seal region 454A, and portions of the etch stop region 456A. Any suitable fabrication process can be used to form the encapsulation layer 438. In aspects of the invention, the encapsulation layer 438 can be formed from a Si-based oxide/nitride, which can include other elements such as C, N, O, and the like.

Figure 7:
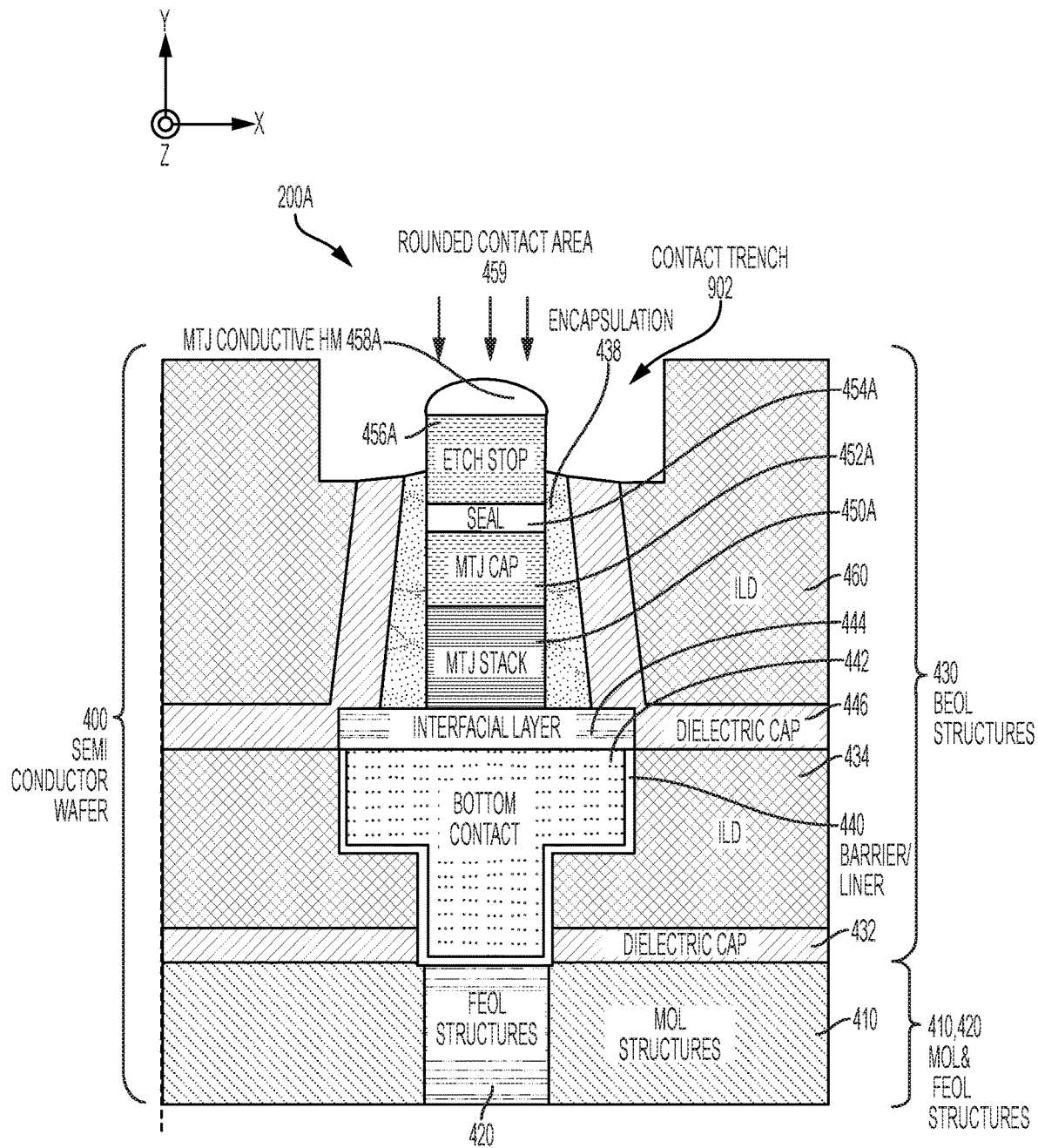

In FIG. 7, known semiconductor fabrication operations have been used to deposit an optional additional region of the dielectric cap 446 around the encapsulation layer 438. Known fabrication operations have also been used to deposit and planarize an ILD region 460, which is then patterned and etched to form a contact trench 902 that exposes the conductive hardmask 458A and sidewall portions of the etch stop region 456A. In aspects of the invention, the ILD 460 can be formed from a low-k dielectric (e.g., k less than about 4), an ultra-low-k (ULK) dielectric (e.g., k less than about 2.5), tetraethoxysilane (TEOS), black diamond III (BDIII), and the like.

Figure 8:
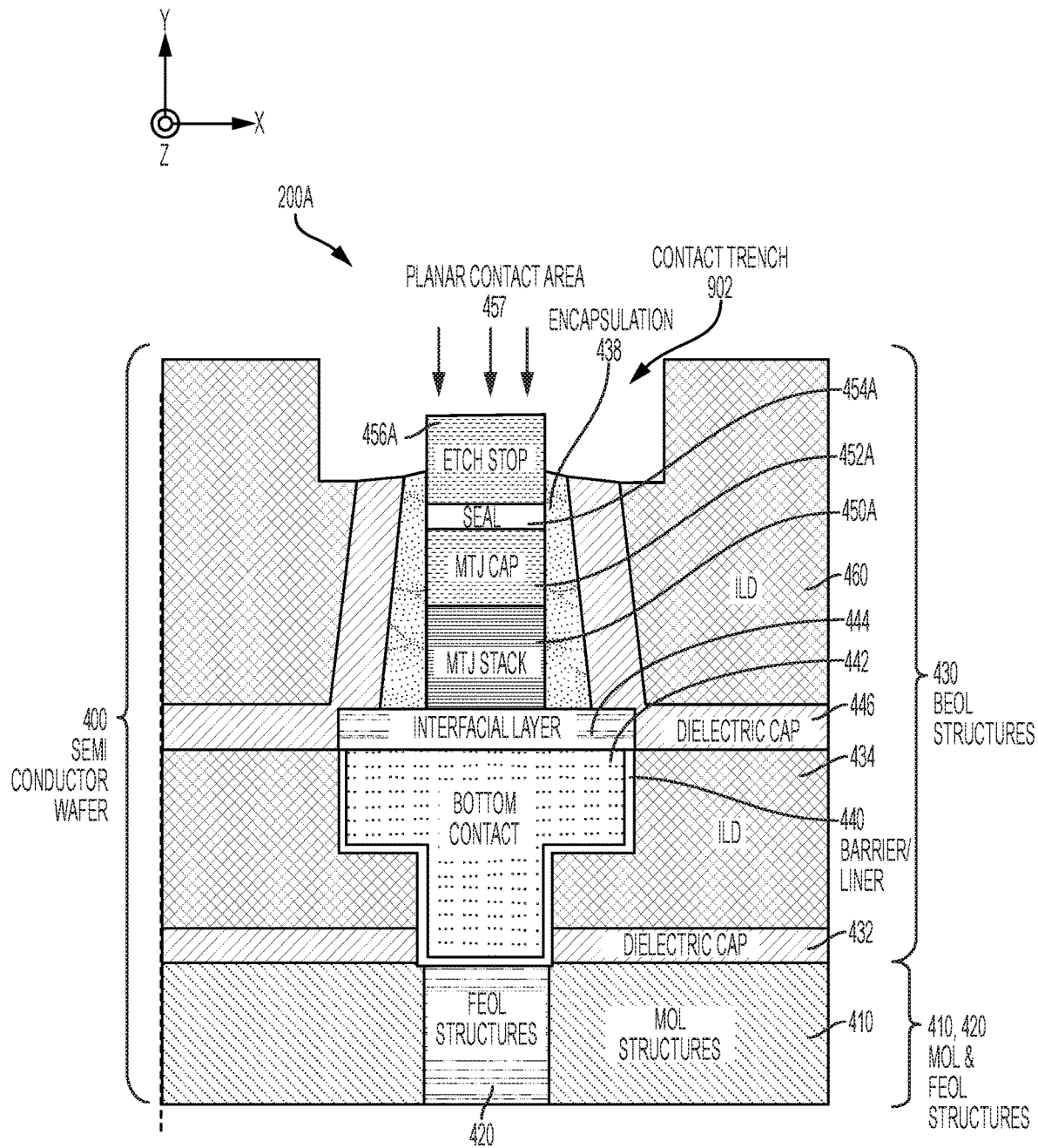

In FIG. 8, known semiconductor fabrication operations have been used to remove the conductive hardmask 458A (shown in FIG. 7), thereby exposing a substantially planar top surface of the etch stop region 456A, which forms a substantially planar contact area 457. In accordance with aspects of the invention, the conductive hardmask 458A is removed using an etch process that is selective to the conductive hardmask 458A but not selective to at least the etch stop region 456A to thereby allow the etch to be applied long enough to completely remove the conductive hardmask region 458A while leaving the etch stop region 456A with a substantially planar contact area 457. For example, where the conductive hardmask 458A is TiN and the etch stop region 456A is Ru, a suitable etch process for removing the conductive hardmask 458A selective to the etch stop region 456A includes application of a suitable wet etchant, for example SC1 (includes $NH_4OH$, DI Water, $H_2O_2$ chemicals) at a temperature of 40 C to 65 C. A suitable commercially available wet etchant can also be sued. In general, suitable commercially available chemistries can include a compound selected from group consisting of -azole, -triazole, and combinations thereof; a compound containing one or more peroxy groups; one or more alkaline metal hydroxides; one or more quaternary ammonium hydroxides; and/or water.

Figure 9:
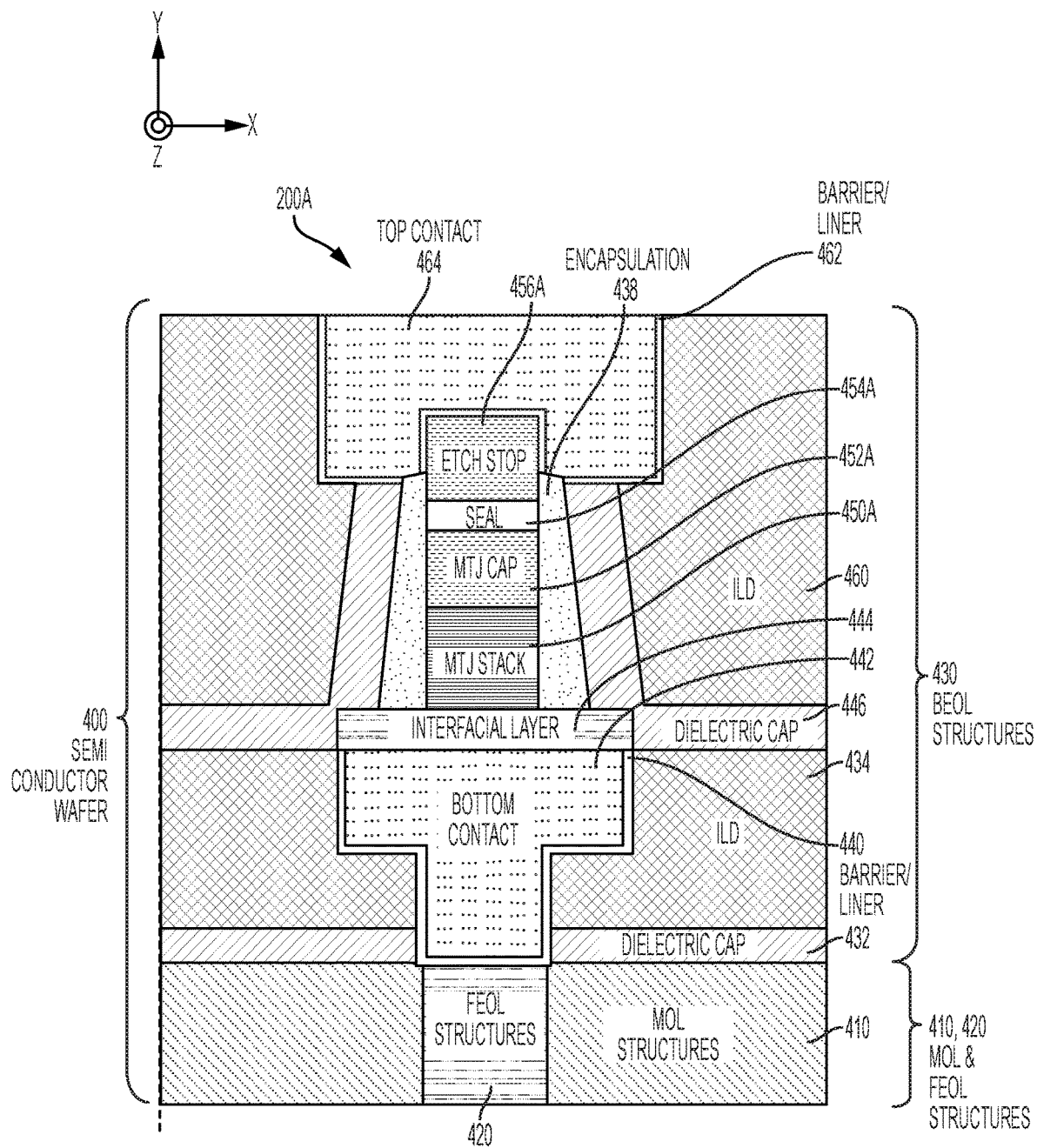
Figure 10:
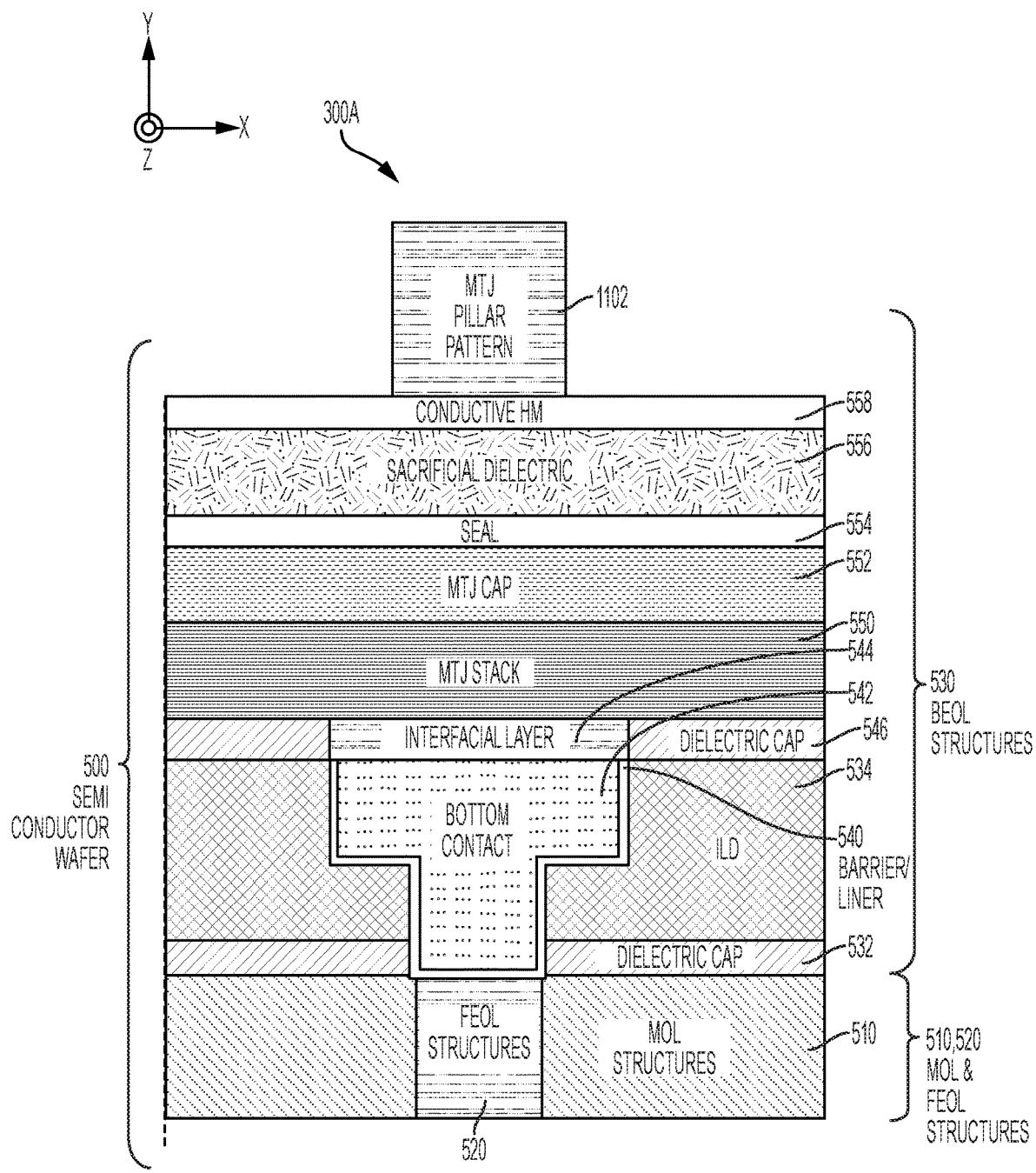

In FIG. 9, known fabrication operations have been used to deposit the barrier/liner 462 in the contact trench 902 (shown in FIG. 8) using any deposition technique suitable for the material that has been selected to form the barrier/liner 462. The remaining volume of contact trench 902 has been filled with the material from which the top contact 464 is formed using, for example, a chemical/electroplating process. The excess material used to form the top contact 464 is removed and planarized to form a flat surface for subsequent processing. For example, cap layer (not shown) can be deposited over the exposed top surface of the top contact 464.

Figure 3:
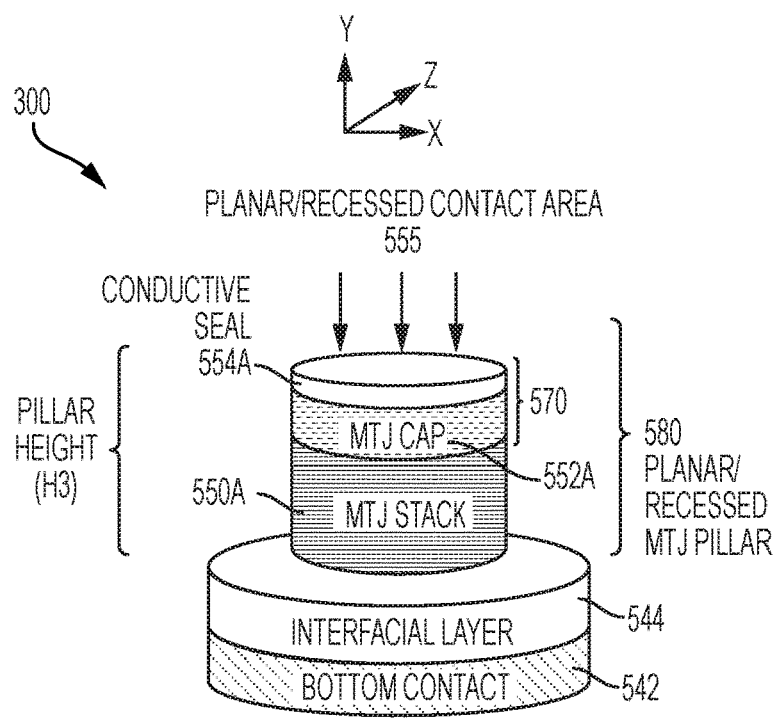
FIG. 3 depicts a planar and recessed MTJ pillar according to embodiments of the invention.

FIG. 3 depicts an MTJ structure 300 in accordance with aspects of the invention. The MTJ structure 300 includes a bottom contact 542, an interfacial layer 544, and a planar/recessed MTJ pillar 580, configured and arranged as shown. The planar/recessed MTJ pillar 580 includes an MTJ stack 550A, a cap 552A formed on the MTJ stack 550A, and a conductive seal region 554A formed over the cap 552A. In accordance with aspects of the invention, the conductive seal region 554A includes a substantially planar contact area 555. The height dimension (H3) of the planar MTJ pillar 580 formed by the conductive seal 554A and the MTJ stack 550A is less than the height H1 of the rounded MTJ pillar 120 (shown in FIG. 1) formed using known fabrication operations.

As a result of fabrication processes in accordance with embodiments of the invention, the conductive seal region 554A has a substantially planar and recessed contact area 555. Fabrication operations for forming the MTJ structure 300 embedded into BEOL interconnects of a semiconductor wafer 500 in accordance with aspects of the invention are depicted in FIGS. 10-14. The portion of the semiconductor wafer 500 that will form the MTJ structure 300 is identified generally in FIGS. 10-14 by reference number 300A. FIG.

10 depicts a semiconductor wafer 500 after an initial set of fabrication operations in accordance with aspects of the invention. A variety of well-known fabrication operations are suitable for forming the semiconductor wafer 500 to the fabrication stage shown in FIG. 10. Accordingly, in the interest of brevity, such well-known fabrication operations are either omitted or described and illustrated at a high level. At the fabrication stage shown in FIG. 10, suitable fabrication operations have been used to form the FEOL structures 520 and the MOL structures 510. Formed on top of the FEOL and MOL structures 520, 510 are a dielectric cap 532, an interlayer dielectric (ILD) region 534, a dielectric cap 546, a barrier/liner 540, a bottom contact 542, and an interfacial layer 544, configured and arranged as shown. The bottom contact 542 can be formed by depositing the dielectric cap 532, the ILD 534, and the dielectric cap 546 then forming a trench through the dielectric cap 546, the ILD 534, and the dielectric cap 532. The barrier/liner 540 is deposited in the trench, the bottom contact 542 is filled in over the barrier/liner 540, and the interfacial layer 544 is formed over the top surface of the bottom contact. Above the dielectric cap 546 and the interfacial dielectric layer 544, various layers have been deposited, including MTJ stack layers 550, MTJ cap layer 552, a conductive seal layer 554, a sacrificial dielectric layer 556, and a conductive hardmask layer 558. A pattern 1102 is formed over the conductive hardmask layer 558 to define the x-z plane dimensions of the planar MJT pillar 580 (shown in FIG. 3) that will be formed from the conductive hardmask layer 558, the etch stop layer 556, the conductive seal layer 554, and the MTJ stack layers 550.

Figure 11:
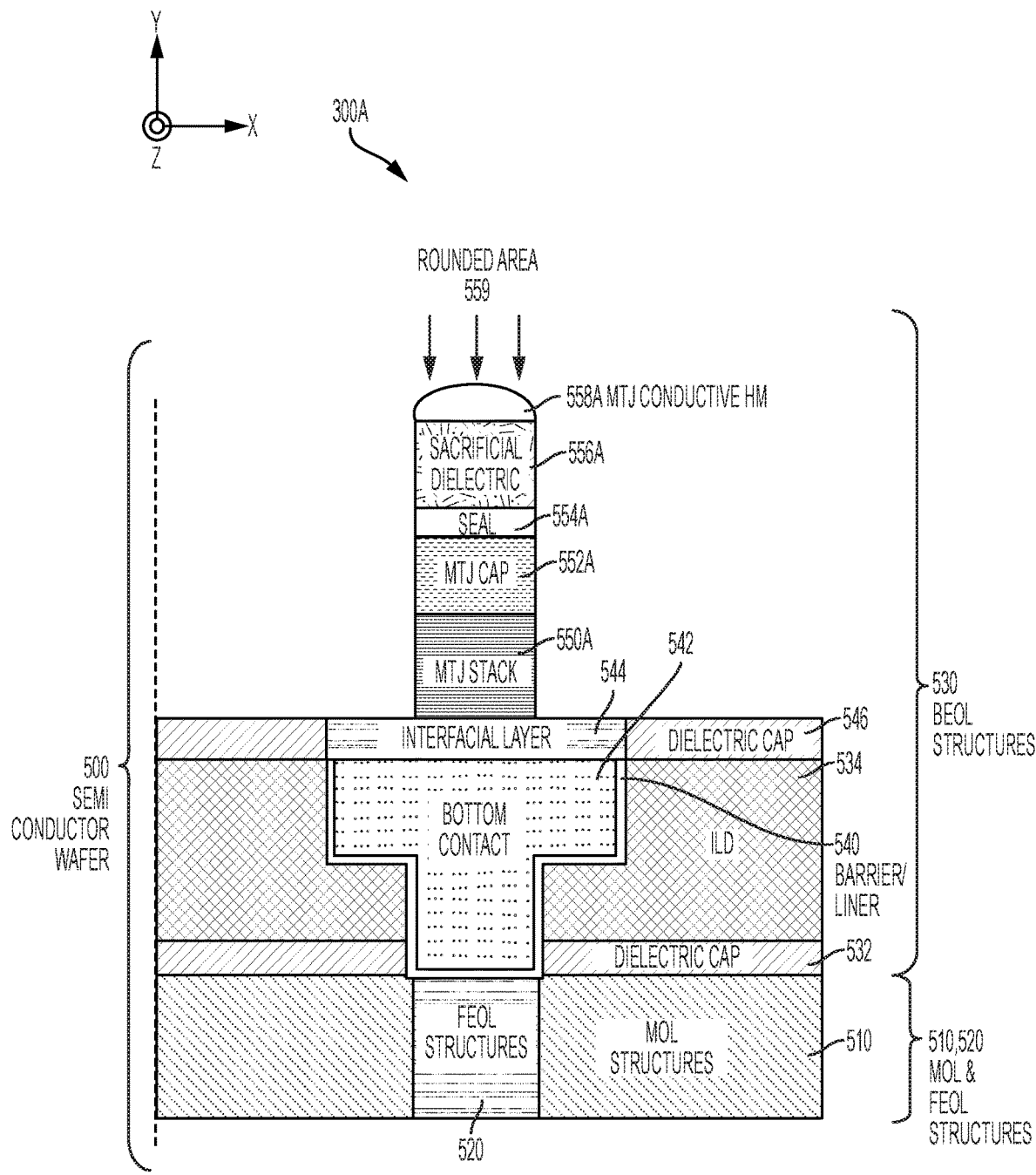

In FIG. 11, the pattern 1102 (shown in FIG. 10) has been transferred to the conductive hardmask layer 558 (shown in FIG. 10) through etching to form a conductive hardmask 558A. Similar to the pattern 1102, the conductive hardmask 558A also defines the x-z plane dimensions of the planar MJT pillar 580 (shown in FIG. 3). The x-z plane dimensions of the conductive hardmask 558A have been transferred through etching (e.g., an ion beam etch (IBE) or a reactive ion etch (RIE)) into the sacrificial dielectric layer 556, the conductive seal layer 554, the MTJ cap layer 552, and the MTJ stack layer 550 (all shown in FIG. 10) to form the sacrificial dielectric region 556A, the conductive seal region 554A, the MTJ cap 552A, and the MTJ stack 550A. The conductive seal region 554A is configured and arranged to protect the MTJ cap 552A. As shown in FIG. 11, a natural result of this etch process is that the etch used to form the sacrificial dielectric region 556A, the conductive seal region 554A, the MTJ cap 552A, and the MTJ stack 550A will also round the exposed top surface 559 of the conductive hardmask 558A in a non-uniform manner.

Figure 12:
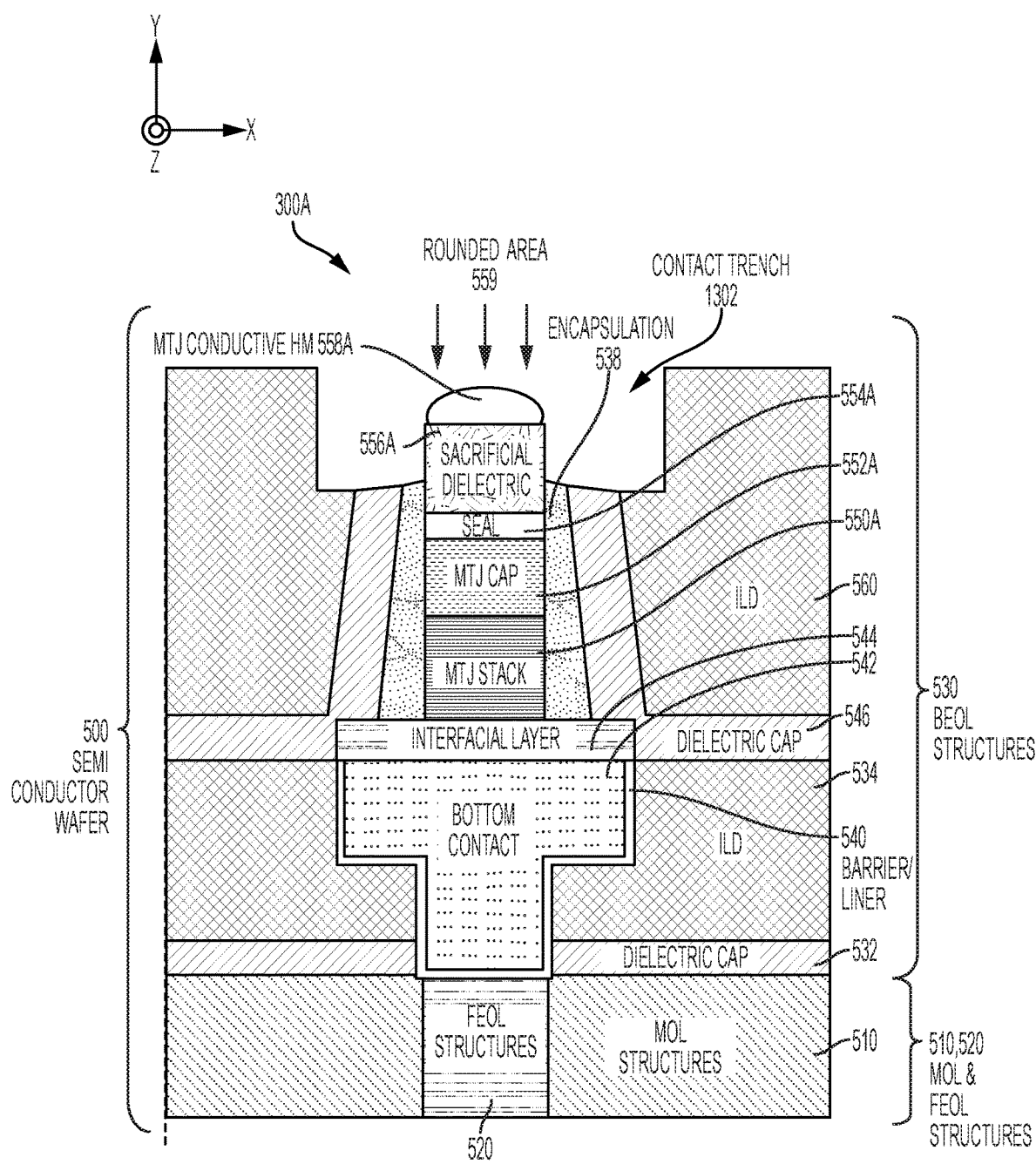

In FIG. 12, known semiconductor fabrication operations have been used to form an encapsulation layer (or spacers) 538 around the MTJ stack 550A, the MTJ cap 552A, the conductive seal region 554A, and portions of the sacrificial dielectric region 556A. Any suitable fabrication process can be used to form the encapsulation layer 538. In aspects of the invention, the encapsulation layer 538 can be formed from a Si-based oxide/nitride, which can include other elements such as C, N, O, and the like. Known semiconductor fabrication operations have also been used to deposit an optional additional region of the dielectric cap 546 around the encapsulation layer 538. Known fabrication operations have also been used to deposit and planarize an ILD region 560, which is then patterned and etched to form a contact trench 902 that exposes the conductive hardmask 558A and sidewall portions of the sacrificial dielectric region 556A. In aspects of the invention, the ILD 560 can be formed from a low-k dielectric (e.g., k less than about 4), an ultra-low-k (ULK) dielectric (e.g., k less than about 2.5), tetraethoxysilane (TEOS), black diamond III (BDIII), and the like.

Figure 13:
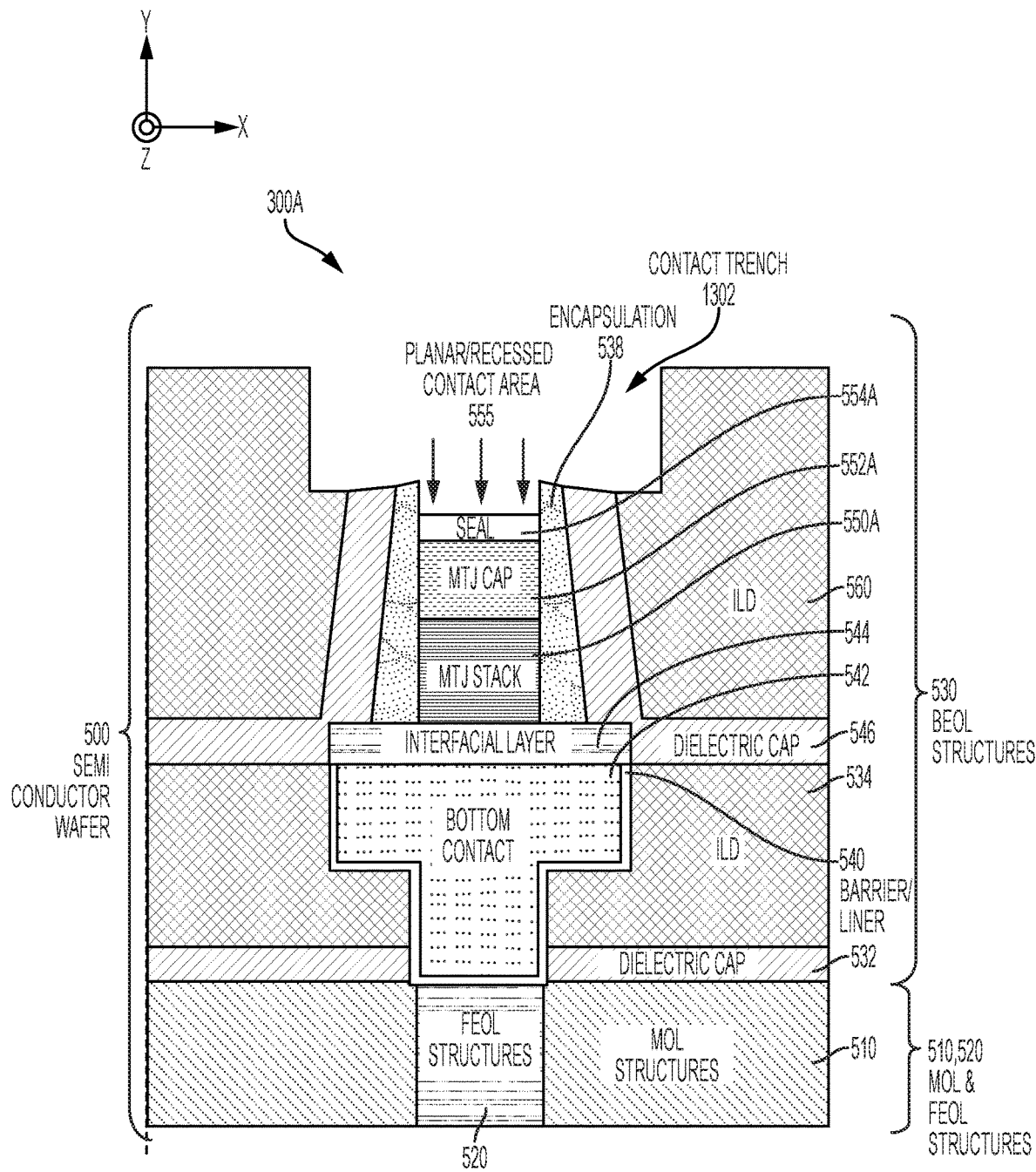

In FIG. 13, known semiconductor fabrication operations have been used to remove the conductive hardmask 558A (shown in FIG. 12) and the sacrificial dielectric 556A (shown in FIG. 12), thereby exposing a substantially planar and recessed top surface of the conductive seal region 554A, which forms a substantially planar/recessed contact area 555. In accordance with aspects of the invention, the substantially planar/recessed contact area 555 is recessed with respect to the top of the encapsulation layer 538. In accordance with aspects of the invention, the sacrificial dielectric 556A is removed using an etch process that is selective to the sacrificial dielectric region 556A but not selective to at least the conductive seal region 554A to thereby allow the etch to be applied long enough to completely remove the sacrificial dielectric region 556A while leaving the conductive seal region 554A with a substantially planar and recessed contact area 555.

Figure 14:
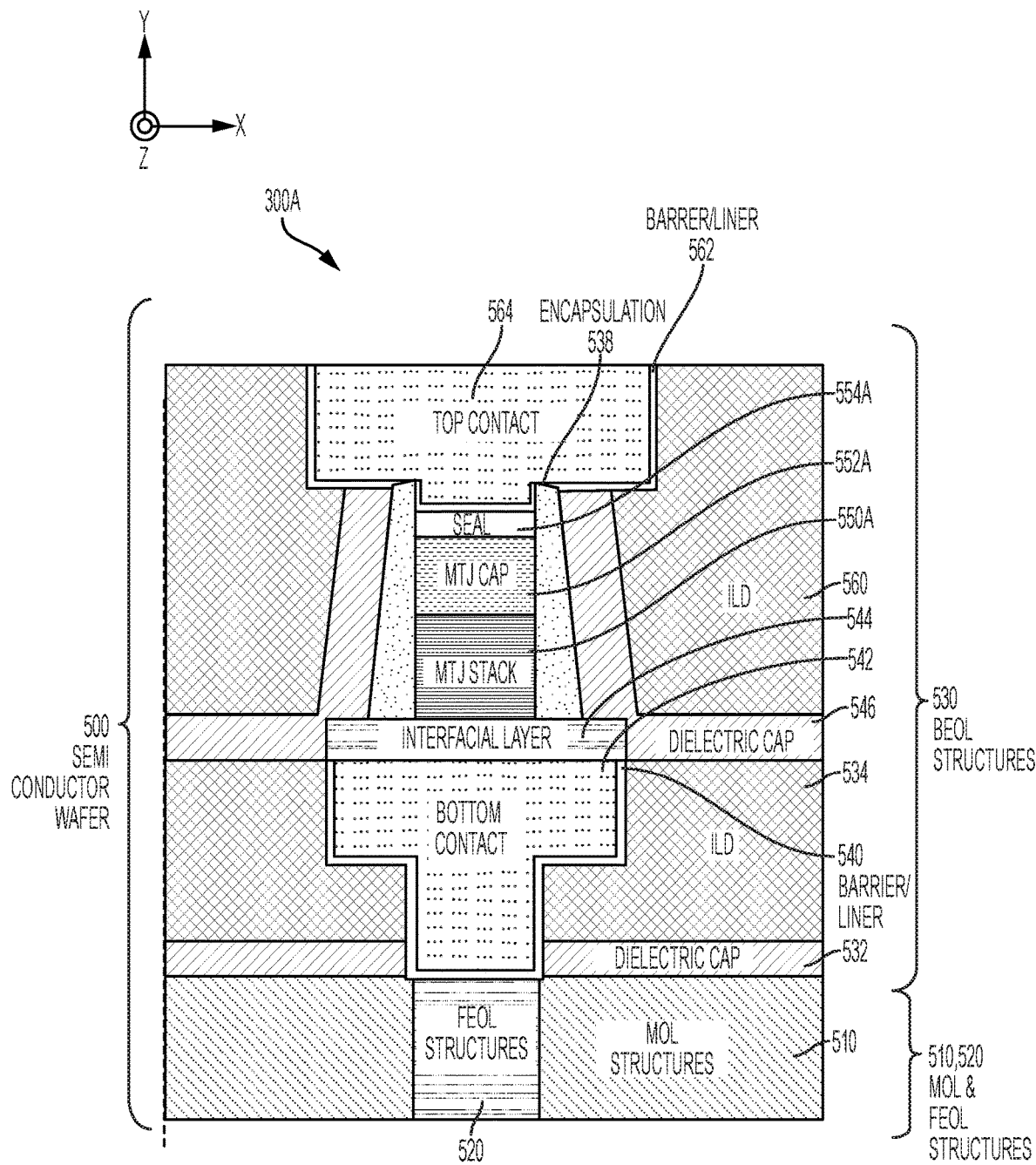

In FIG. 14, known fabrication operations have been used to deposit the barrier/liner 562 in the contact trench 1302 (shown in FIG. 13) using any deposition technique suitable for the material that has been selected to form the barrier/liner 562. The remaining volume of contact trench 1302 has been filled with the material from which the top contact 564 is formed using, for example, a chemical/electroplating process. The excess material used to form the top contact 564 is removed and planarized to form a flat surface for subsequent processing. For example, cap layer (not shown) can be deposited over the exposed top surface of the top contact 564. In accordance with aspects of the invention, because the contact area 555 is recessed below the encapsulation layer 538, the top contact 564 is self-aligned to the contact area 555.

Notwithstanding the above, the following materials are contemplated for use in embodiments of the invention. The dielectric caps 432, 446, 532, 546 can be formed from a Si-based oxide/nitride and can include other elements such as C, N, O, and the like. The ILDs 434, 460, 534, 560 312, 314 can be formed from a low-k dielectric (e.g., k less than about 4), an ultra-low-k (ULK) dielectric (e.g., k less than about 2.5), tetraethoxysilane (TEOS), black diamond III (BDIII), and the like. The barrier/liners 440, 462, 540, 562 can be formed from Ta-based barrier material, a self forming barrier, a Co liner, an Ru liner, a Ta liner, a Ti-based barrier, a Ti liner, a W liner, and similar materials. The bottom/top contacts 442, 464, 542, 564 can be formed from a variety of conductive materials including, for example, Cu, CuMn, W, Co, and Ru. The interfacial layers 444, 544 can be formed from Nb, NbN, W, WN, Ta, TaN, Ti, TiN, Ru, Mo, Cr, V, Pd, Pt, Rh, Sc, Al and other high melting point metals or conductive metal nitrides. The MTJ cap layers 452, 552 can be formed from Nb, NbN, W, WN, Ta, TaN, Ti, TiN, Ru, Mo, Cr, V, Pd, Pt, Rh, Sc, Al and other high melting point metals or conductive metal nitrides. The conductive seal layer 454, 554 can be formed from Nb, NbN, W, WN, Ta, TaN, Ti, TiN, Ru, Mo, Cr, V, Pd, Pt, Rh, Sc, Al and other high melting point metals or conductive metal nitrides. The etch stop layer 456 can be formed from Nb, NbN, W, WN, Ta, TaN, Ti, TiN, Ru, Mo, Cr, V, Pd, Pt, Rh, Sc, Al and other high melting point metals or conductive metal nitrides. The sacrificial dielectric layer 556 can be formed from TEOS, sacrificial SiN, octamethylcyclotetrasiloxane (OMCTS), and other Si-based nitrides/oxides, chemically active porous dielectrics. The conductive hardmask 458, 558 can be formed from Nb, NbN, W, WN, Ta, TaN, Ti, TiN, Ru, Mo, Cr, V, Pd, Pt, Rh, Sc, Al and other high melting point metals or conductive metal nitrides.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a memory element pillar, the method comprising:
   forming memory element stack layers;
   forming a conductive cap layer over the memory element stack layers;
   forming a conductive seal layer over the cap layer;
   forming a conductive etch stop layer over the conductive seal layer, wherein the conductive etch stop layer comprises a substantially planar top surface;
   forming a hardmask layer over the substantially planar surface of the conductive etch stop layer, wherein the hardmask layer comprises a substantially planar top surface and a substantially planar bottom surface in contact with the substantially planar top surface of the conductive etch stop layer; and
   forming a hardmask from the hardmask layer, wherein forming the hardmask results in the hardmask comprising a substantially nonplanar top surface, wherein the hardmask defines dimensions of the memory element pillar;
   wherein the hardmask comprises a hardmask material having a first etch selectivity to an etchant that can remove the hardmask material;
   wherein the conductive etch stop layer comprises an etch stop material having a second etch selectivity to the etchant that can remove the hardmask material; and
   wherein the first etch selectivity is greater than the second etch selectivity.

2. The method of claim 1 further comprising removing portions of the conductive etch stop layer, the conductive seal layer, the conductive cap layer, and the memory stack layers that are not under the hardmask.

3. The method of claim 2 further comprising using the etchant to remove the hardmask and expose the substantially planar top surface of the conductive etch stop layer.

4. The method of claim 3, wherein the memory element pillar comprises the portions of the conductive etch stop layer, the conductive seal layer, the conductive cap layer, and the memory stack layer that are under the hardmask.

5. The method of claim 4 further comprising communicatively coupling a bottom contact to the memory element stack.

6. The method of claim 5 further comprising communicatively coupling a top contact to the substantially planar top surface of the conductive etch stop layer.

7. The method of claim 6 further comprising communicatively coupling the top contact to sidewalls of the conductive etch stop layer.

8. The method of claim 6, wherein the memory element stack comprises a magnetic tunnel junction (MTJ) stack.

9. A method of forming a memory element pillar, the method comprising:
  forming memory element stack layers;
  forming a conductive cap layer over the memory element stack layers;
  forming a conductive seal layer over the cap layer, wherein the conductive seal layer comprises a substantially planar surface;
  forming a sacrificial layer over the conductive seal layer; and
  forming a hardmask layer over the sacrificial layer; and
  forming a hardmask from the hardmask layer, wherein forming the hardmask results in the hardmask comprising a substantially nonplanar top surface;
  wherein the hardmask defines dimensions of the memory element pillar.

10. The method of claim 9 further comprising removing portions of the sacrificial layer, the conductive seal layer, the conductive cap layer, and the memory stack layers that are not under the hardmask.

11. The method of claim 10 further comprising removing the hardmask and the sacrificial layer to expose the substantially planar surface of the conductive seal layer.

12. The method of claim 11, wherein the memory element pillar comprises the portions of the conductive seal layer, the conductive cap layer, and the memory stack layer that are under the hardmask.

13. The method of claim 12 further comprising communicatively coupling a bottom contact to the memory element stack.

14. The method of claim 13 further comprising communicatively forming a spacer around sidewalls of the memory element pillar such that the substantially planar surface of the conductive seal layer is below top portions of the spacer.

15. The method of claim 14 further comprising coupling a top contact to the substantially planar surface of the conductive seal layer, wherein the top portions of the spacer self-align at least a portion of the top contact to the substantially planar surface of the conductive layer.

16. The method of claim 15, wherein the memory element stack comprises a magnetic tunnel junction (MTJ) stack.

17. An embedded memory element pillar structure comprising:
  a semiconductor wafer having a dielectric region; and
  a memory element pillar embedded in the dielectric region;
  wherein the memory element pillar comprises:
    a memory element stack;
    a conductive cap over the memory element stack;
    a conductive seal layer over the cap layer; and
    a conductive etch stop layer over the conductive seal layer;
  wherein the conductive etch stop layer comprises a substantially planar surface;
  wherein the etch stop layer comprises an etch selectivity characteristic configured to substantially stop an etch operation used to remove a hardmask that defines dimensions of the memory element pillar; and
  wherein a top contact is communicatively coupled to the substantially planar surface of the conductive etch stop layer.

18. The structure of claim 17, wherein a bottom contact is communicatively coupled to the memory element stack.

19. The structure of claim 18, wherein the top contact is communicatively coupled to sidewalls of the conductive etch stop layer.

20. The structure of claim 18, wherein the memory element stack comprises a magnetic tunnel junction (MTJ) stack.

* * * * *